(12) United States Patent
Trieu et al.

(10) Patent No.: US 6,479,890 B1
(45) Date of Patent: Nov. 12, 2002

(54) SEMICONDUCTOR MICROSYSTEM EMBEDDED IN FLEXIBLE FOIL

(75) Inventors: Hoc Khiem Trieu, Duisburg; Wilfried Mokwa, Krefeld; Lutz Ewe, Duisburg, all of (DE)

(73) Assignee: Fraunhofer-Gesellschaft Zur Foerderung Der Angewandten Forschung E.V., Munich (DE)

( * ) Notice: Subject to any disclaimer, the term of this patent is extended or adjusted under 35 U.S.C. 154(b) by 0 days.

(21) Appl. No.: 09/600,515

(22) PCT Filed: Jan. 22, 1998

(86) PCT No.: PCT/EP98/00344

§ 371 (c)(1),
(2), (4) Date: Aug. 31, 2000

(87) PCT Pub. No.: WO99/38211

PCT Pub. Date: Jul. 29, 1999

(51) Int. Cl.[7] .............................................. H01L 23/02
(52) U.S. Cl. ...................... 257/678; 257/415; 438/50; 438/106; 438/121
(58) Field of Search ................................ 257/415, 678; 438/50, 106, 121

(56) References Cited

U.S. PATENT DOCUMENTS

| 4,754,555 A | * | 7/1988 | Hanak | 438/66 |
|---|---|---|---|---|
| 5,324,687 A | * | 6/1994 | Wojnarowski | 438/107 |
| 5,401,688 A | | 3/1995 | Yamaji et al. | 437/209 |
| 5,452,182 A | * | 9/1995 | Eichelberger et al. | 361/749 |
| 6,027,958 A | * | 2/2000 | Vu et al. | 438/110 |

FOREIGN PATENT DOCUMENTS

| JP | 5-211275 | | 8/1993 | 23/522 |
|---|---|---|---|---|
| JP | 08111360 A | * | 4/1996 | H01L/21/02 |
| JP | 63-5543 | | 1/1998 | 21/78 |

* cited by examiner

Primary Examiner—Nathan J. Flynn
Assistant Examiner—Scott R Wilson
(74) Attorney, Agent, or Firm—Michael A. Glenn; Kirk Wong

(57) ABSTRACT

A microsystem comprises a flexible foil, a plurality of semiconductor elements embedded in said flexible foil, and a connection line arranged substantially on said flexible foil and used for electrically connecting at least two semiconductor elements. For producing the microsystem, electronic components are first integrated in a semiconductor layer provided on a wafer. Subsequently, the semiconductor areas which are not required between the electronic components are etched away, whereupon the flexible foil is applied. A connection line is then applied to the flexible foil so as to interconnect the individual semiconductor elements. Finally, the semiconductor is etched away from the back so as to obtain the microsystem in the case of which the individual semiconductor elements are mechanically connected only by the flexible foil but no longer by the semiconductor substrate.

17 Claims, 1 Drawing Sheet

SEMICONDUCTOR MICROSYSTEM EMBEDDED IN FLEXIBLE FOIL

FIELD OF THE INVENTION

Figure 1:
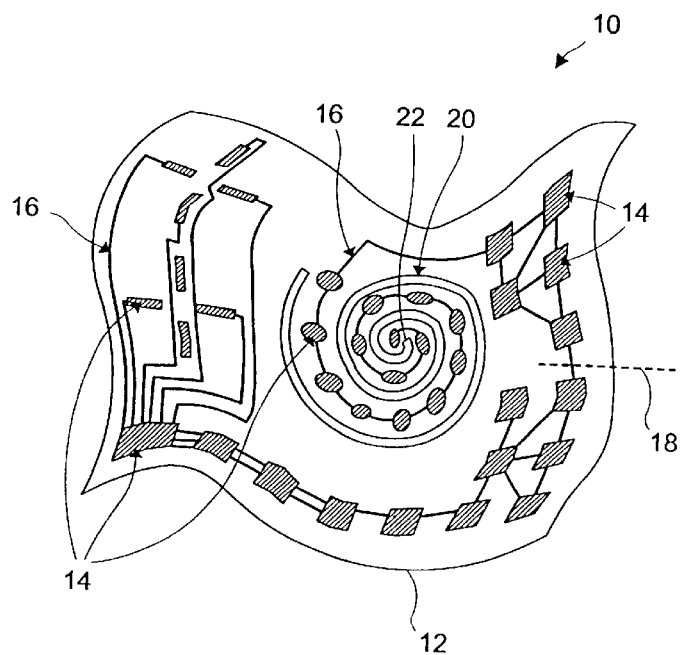

The present invention relates to microsystems and methods for producing microsystems. In particular, the present invention relates to flexible Microsystems which can be given almost any desired shape.

BACKGROUND OF THE INVENTION AND PRIOR ART

Due to the very fast progress in the field of silicon technology, whole Microsystems are integrated in silicon in an increasing number of cases. These modern microsystems include in addition to the evaluation electronics for a sensor arrangement also the sensors and actuators themselves, which are also formed e.g. in a silicon substrate by means of micromechanical technologies. At present, such Microsystems are produced from monocrystalline-silicon substrates in most cases. The electric properties of monocrystalline silicon permit the integration of such complex circuits. For realizing sensor elements and actuator elements, the mechanical properties of the silicon as a material itself are utilized in addition to the electric properties. Other electronic materials, such as amorphous or polycrystalline silicon and also conductive polymers, which can be used alternatively, are far from achieving an electric behavior comparable to that of monocrystalline silicon.

Due to the high mechanical hardness of silicon, substrates used for known Microsystems are of solid silicon and therefore rigid and planar. The wafer thickness is in the order of a few hundred micrometres. This is the reason for the fact that such microsystem chips are not suitable to be used in surroundings with uneven support surfaces. The disadvantage of the lack of mechanical flexibility becomes increasingly apparent as the size of the chip area increases. It should be noted that complex microsystems may occupy chip areas of a considerable size, taking into account that, in addition to an integrated circuit, also the sensor and the actuator themselves are arranged on the wafer.

A known approach to increasing the flexibility of microsystems is described in Trieu, H. K., Ewe, L., Mokwa, W.: "Flexible Mikrostrukturen in Silizium", Fraunhofer IMS Jahresbericht 1996, pp. 17–19. For solving the flexibility problem, mechanically flexible MESAflex substrates are suggested consisting of a silicon island array with silicon islands which have a width of 0.8 to 2 mm and a thickness of 0.3 to 0.7 mm and which are interconnected via thin silicon membranes (thickness<20 $\mu$m). In comparison with conventional microsystems, which are integrated on a single silicon wafer with a thickness of a few hundred micrometres, such MESAflex substrates are characterized by a much higher flexibility. Arrays of such silicon islands permit linear deflections of more than 90° out of the principal plane.

However, these monocrystalline silicon membranes, which interconnect the silicon islands, are still too sensitive and fragile for many cases of use. Furthermore, the local flexibility, i.e. the flexibility in a certain area of the microsystem, is limited by the comparatively large silicon islands.

SUMMARY OF THE INVENTION

It is the object of the present invention to provide microsystems which are reliable and, nevertheless, highly flexible.

In accordance with a first aspect of the present invention, this object is achieved by a microsystem comprising a flexible foil; a plurality of semiconductor elements embedded in said flexible foil, said flexible foil supporting the semiconductor elements without any rigid support being provided; and at least one connection line arranged substantially on said flexible foil and used for electrically connecting at least two semiconductor elements.

In accordance with a second aspect of the present invention, this object is achieved by a method for producing a microsystem comprising integrating electronic components in a semiconductor layer, which is provided on a wafer surface in such a way that at least two electronic components are arranged at locally different positions in the wafer; etching the areas between said electronic components free whereby semiconductor elements connected to the wafer and projecting beyond said wafer are produced; applying a flexible foil to the wafer surface in such a way that the semiconductor elements are embedded in said flexible foil; applying a connection line to the flexible foil in such a way that said connection line is connected to contact areas of semiconductor elements; and etching the wafer away from the back of said wafer in such a way that the semiconductor elements are no longer mechanically interconnected by said wafer and said semiconductor elements are held by said flexible foil without any rigid support being provided.

A microsystem according to the present invention comprises a flexible foil, a plurality of semiconductor elements embedded in this flexible foil, and at least one connection line arranged substantially on this flexible foil and used for electrically connecting at least two semiconductor elements. The characteristic features with regard to which such a microsystem according to the present invention differs from the prior art are that semiconductor elements, which may be integrated circuits and also sensors or actuators, are no longer interconnected via a wafer or via silicon membranes. The use of a wafer, which mechanically interconnects all the individual semiconductor elements and which turns the microsystem into a rigid or, when silicon membranes are used, comparatively brittle object, can be dispensed with due to the use of a flexible foil having the semiconductor elements embedded therein. The individual semiconductor elements are only supported by the flexible foil according to the present invention. Hence, they are also insulated from one another, when the flexible foil is an insulating foil. According to the present invention, the flexible foil can then have applied thereto the necessary structure of conducting tracks and bus lines so as to interconnect the individual semiconductor elements for obtaining a desired microsystem.

The semiconductor elements can, quite generally, be regarded as flat rectangular parallelepipeds which can be embedded in the flexible foil in several ways. On the one hand, the semiconductor elements, which have only thicknesses of a few micrometres down to the submicrometre range, can be embedded in the flexible foil in such a way that both main surfaces of the semiconductor elements having the shape of flat rectangular parallelepipeds are exposed. A connection line can then be applied directly to connecting areas of a semiconductor element. Preferably, the very thin semiconductor elements are, however, embedded in a foil in such a way that only the back of the semiconductor elements is exposed. The front of the semiconductor elements having the connecting areas arranged thereon is then also covered by the flexible foil. For producing connection lines, it will then be necessary to provide via holes in the flexible foil so as to connect and interconnect the semiconductor elements.

According to the present invention, it is essentially the flexible foil that interconnects the individual semiconductor elements mechanically. The flexibility of the microsystem is therefore no longer determined by the rigid semiconductor elements, but essentially by the flexible foil. Further advantageous possibilities exist for adapting the flexibility of the microsystem to specific circumstances, i.e. for adjusting a local flexibility of, the microsystem. By arranging the semiconductor elements relative. to one another in a specific manner, e.g. in functional blocks, it is possible to provide the microsystem with a flexibility of such a nature that the microsystem can be folded or rolled. Another advantage of the present invention is that specific areas of the flexible foil can be shaped by means of "reinforcing" bridges which are adapted to be geometrically structured in an arbitrary manner so as to provide e.g. a comparatively stiff microsystem in the x-direction, but a very flexible microsystem in the y-direction. It follows that, just as a specific arrangement of the semiconductor elements in the flexible foil, this measure permits the production of a local stiffness or of the contrary, viz. a local flexibility of the microsystem.

Furthermore, it is possible to influence the properties of the flexible foil directly, i.e. when the flexible foil used is a ploymer foil, the stiffness of the foil can be adjusted locally by different curing conditions.

In comparison with known flexible circuits, in the case of which semiconductor chips are applied to a flexible substrate by means of soldering or by means of an adhesive, the microsystem according to the present invention, in the case of which the semiconductor elements are embedded in the flexible foil, offers the advantage that loads caused when the microsystem is being bent are taken up substantially completely by the flexible foil but not by the semiconductor element, whereby mechanical stresses occurring when the microsystem is being bent will not result in piezoresistive influences on the electric parameters of the semiconductor elements. Although the flexible microsystem as a whole can be adapted to almost any shape or can be given almost any shape, the individual semiconductor elements as such will maintain their individual structure, i.e. they will not be bent, and this is particularly important in the case of certain sensors or actuators whose mechanical shape must not be "distorted".

Figure 2:
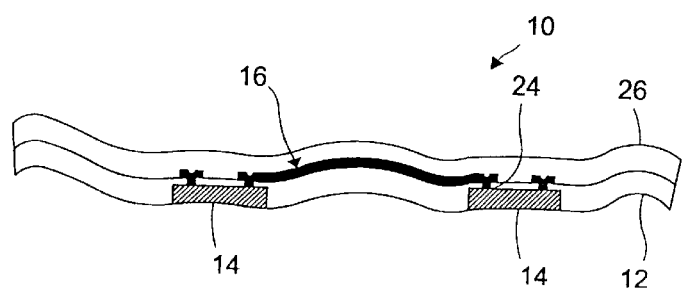

In the following, preferred embodiments of the present invention will be explained in more detail making reference to the drawings enclosed, in which:

FIG. 1 shows a general schematic representation of a microsystem according to the present invention; and FIG. 2 shows a cross-sectional representation of a microsystem according to a preferred embodiment of the present invention.

FIG. 1 shows a top view of a microsystem 10 according to the present invention. The microsystem 10 comprises a flexible foil 12 having embedded therein a plurality of semiconductor elements 14. The semiconductor elements 14 are interconnected by means of connection lines 16 which can be implemented either as conventional conducting tracks or as complex bus structures.

The semiconductor elements are preferably small pieces of a monocrystalline semiconductor material, which can be embedded in the flexible foil in an arbitrary arrangement, as can be seen from FIG. 1. The semiconductor elements can be integrated, active and/or passive components or they may also be sensors or actuators. Such micromechanical elements are known in the field of technology and will not be described in detail. The flexible foil 12 is preferably a very flexible plastic foil, which can consist e.g. of a ploymer.

Due to the fact that the semiconductor elements 14 are embedded in the flexible foil 12, the microsystem 10 according to the present invention is extremely flexible and adaptable to arbitrary surfaces. For offering additional flexibility to the microsystem 10, it will be advantageous to arrange individual semiconductor elements 14 in functional groups, as can be seen e.g. on the right-hand side of FIG. 1. In this kind of arrangement, the semiconductor elements of one functional group are arranged at the upper right, whereas the semiconductor elements of another functional group are arranged at the bottom right. Due to the arrangement of the semiconductor elements on the right-hand side of FIG. 1, the microsystem has a higher flexibility about a line 18 than about a line extending at right angles to this line 18. It follows that a local stiffness is imparted to the microsystem by the arrangement of the semiconductor elements alone. This will be of advantage especially in cases where the microsystem 10 is to be bent or rolled about the line 18 so as to be adapted to a body of arbitrary shape.

A further possibility of providing the flexible foil with local stiffness and local flexibility, respectively, is the provision of a geometric substructuring 20 which can be implemented in the flexible foil e.g. in the form of reinforcing ribs having an arbitrary shape. The spiral shaped geometric substructuring 20 permits a local flexibility of the microsystem 10 of such a nature that a microsystem area designated by 22 can be deformed out of the plane of the drawing so as to form a kind of "steeple hat". Due to the geometric substructuring 20 in the area 22, the microsystem 10 is, however, comparatively stiff against folding about a line in the plane of the microsystem 10. Further geometric substructurings having simpler shapes could be provided in the form of ribs which are horizontal e.g. with regard to FIG. 1 and which extend parallel with respect to line 18, whereby, when a plurality of such parallel, horizontal ribs is provided, folding will be possible only about line 18, but not about a line extending at right angles to line 18. It follows that, due to the design properties existing for flexible foils, arbitrary local flexibilities can be adjusted so as to adapt the microsystem according to the present invention to arbitrary bases or so as to give it an arbitrary desired shape.

A further possibility of implementing the microsystem 10 such that it is locally flexible is to provide the flexible foil with an anisotropic stiffness by locally different degrees of polymer curing. Preferably, also the bending stiffness of the semiconductor elements 14 made e.g. from monocrystalline silicon is set such that it is at least twice as large and preferably two to three orders of magnitude larger than that of the flexible plastic foil. The mechanical stresses occurring in the case of bending are in this way predominantly limited to the flexible plastic foil and the electronically active components of the microsystem 10 remain stress-free to a very large extent so as to avoid piezoresistive influences on the electric parameters of these semiconductor elements 14. In other cases of use, where active areas are intended to react to stress influences in a particularly sensitive manner, e.g. in the case of a tactile sensor, the above- mentioned possibilities of adjusting the stiffness and the flexibility, respectively, can be utilized inversely so as to obtain the highest possible sensitivity to mechanical loads or displacements.

FIG. 2 shows a cross-sectional view of a preferred embodiment of- the microsystem 10. In FIG. 2 it can be seen clearly how the semiconductor elements 14 are embedded in the flexible foil 12 and how the connection line 16 is applied to the flexible foil 12. When the flexible foil extends beyond the front of the semiconductor elements 14, via holes 24 are produced in this flexible foil so as to contact the connection line 16 with contact areas of the semiconductor elements 14. For improving the mechanical stability and for the purpose of insulation, an additional flexible foil 26 is applied on top of the connection line 16 by means of which the connection line 16 is sandwiched between the flexible foil 12 and the flexible foil 26.

In the following, the method used according to the present invention for producing a microsystem will be described. Starting from a semiconductor wafer, which is preferably a SIMOX wafer with a thin semiconductor cover layer made preferably from monocrystalline silicon and having a thickness of e.g. some 100 nm, a monocrystalline silicon layer having a thickness of some micrometres can optionally be grown, e.g. by means of epitaxy. The electrical components required for the microsystem can now be integrated on this thin monocrystalline silicon film in a suitable arrangement. In extreme cases, such an electronic component may only comprise a single transistor or a small group of transistors. In other extreme cases, such a component may be a whole micromechanical sensor or actuator. By etching away the semiconductor regions which are no longer required between the electronic components, many small pieces of preferably monocrystalline silicon are formed, which are insulated on all sides and which have been referred to as semiconductor elements 14 up to now. These semiconductor elements 14 are, however, still mechanically interconnected by means of the SIMOX wafer. A step of etching free has the effect that the individual semiconductor elements 14 project beyond the surface of the wafer, since the non-required areas located between these semiconductor elements have been etched away. This surface of the wafer from which the semiconductor elements 14 project has now applied thereto a flexible foil 12, which is preferably implemented as a polymer membrane. The thickness of the foil will depend on general stability criteria which are also determined by the special field of use of the microsystem. When the flexible foil 12 has been cured, the connection line 16 or, in the case of a larger microsystem of the kind shown in FIG. 1, a plurality of connection lines is applied to the flexible foil 12. As has already been mentioned, via holes may be provided, when the thickness of the flexible foil 12 exceeds the thickness of the semiconductor elements 14. For increasing the stability still further and for the purpose of passivation, the additional flexible foil 26 is applied directly to the connection lines and to the first flexible foil 12, respectively, after the application of the conducting tracks. The microsystem now exists in the form of a dielectrically insulated sandwich structure, the semiconductor elements 14 being embedded in the polymer. If necessary, a multilayer metallization can be provided by repeatedly applying the sandwich technique and by inserting via holes. Also the additional flexible foil 26 can be substructured for adjusting the mechanical voltage distribution and for adjusting or rather providing a local flexibility or stiffness in this way. The self-supporting microsystem according to the present invention is finally obtained by etching the support wafer free in a wet-chemical etching step. In the course of this step, the wafer is etched away completely from the back of the wafer in such a way that only the semiconductor elements 14 will remain; these semiconductor elements 14 are then mechanically interconnected only by the flexible foil and to a small degree by the connection lines.

The microsystem according to the present invention, which is also referred to as intelligent ultra flexible foil, permits an extension of the field of use of microsystem technology. This concerns, on the one hand, the use of the chips in uneven surroundings. On the other hand, the achieved mechanical flexibility of the structure permits the construction of three-dimensional chip geometries which cannot be realized by means of the conventional planar structures and which offer completely new possibilities in the fields of sensor and actuator technology. In addition, such mechanically flexible chips are simply ideal for use in medical engineering, if it is, for example, necessary to minimize the traumatic effect of implants on the biological tissue. In this respect, there is a large demand in the field of implantable intelligent prostheses, i.e. prostheses equipped with integrated circuits. It follows that the microsystem according to the present invention is excellently suitable for a coupling between an electronic and a biological system. Further biological applications can be seen e.g. in the use of the microsystem as an artificial retina, as a nerve stimulator or as a nerve contact.

What is claimed is:

1. A microsystem comprising:
   a flexible foil;
   a plurality of semiconductor elements embedded in said flexible foil, said flexible foil supporting the semiconductor elements without any rigid support being provided; and
   at least one connection line arranged substantially on said flexible foil and used for electrically connecting at least two semiconductor elements;
   wherein the flexible foil has a locally anisotropic stiffness of such a nature that the microsystem has locally different degrees of flexibility.

2. A microsystem according to claim 1, wherein the semiconductor elements are arranged with respect to said foil in such a way that the microsystem has locally different degrees of flexibility.

3. A microsystem according to claim 1, wherein the flexible foil is geometrically substructured in such a way that the microsystem has locally different degrees of flexibility.

4. A microsystem according to claim 1, wherein the semiconductor elements are at least twice as stiff as the flexible foil.

5. A microsystem according to claim 1, wherein at least some of the semiconductor elements consist of monocrystalline silicon.

6. A microsystem according to claim 1, wherein the semiconductor elements are essentially flat and have dimensions of a few micrometres down to the submicrometre range at right angles to the flat side.

7. A microsystem according to claim 1, wherein the plurality of semiconductor elements includes passive and/or active electronic circuits.

8. A microsystem according to claim 1, wherein the plurality of semiconductor elements includes electromechanical microsensors and/or microactuators.

9. A microsystem according to claim 1, wherein the connection line is a conducting track between two semiconductor elements or a bus structure which connects a plurality of semiconductor elements.

10. A microsystem according to claim 1, wherein the flexible foil comprises a polymer material.

11. A microsystem according to claim 1, wherein the local stiffness of active regions is lower than that of neighbouring regions so as to implement a local sensitiveness of the microsystem to deformations.

12. A microsystem according to claim 1, wherein the semiconductor elements are accommodated in the flexible foil in such a way that they are enclosed by said flexible foil with the exception of a main surface, and wherein the connection line is applied to the foil and the semiconductor elements are contacted through via holes in the foil.

13. A microsystem according to claim 12, wherein an additional flexible foil is applied on top of the connection line in such a way that the connection line is arranged in a sandwich structure between the flexible foil, in which the semiconductor elements are embedded, and said additional flexible foil.

14. A microsystem according to claim 13 having a multilayered structure, wherein several connection line layers are separated by respective flexible foils, and wherein the semiconductor elements and the connection lines of individual layers are electrically connected to one another through via holes in respective flexible foils.

15. A microsystem comprising:
   a flexible foil;
   a plurality of semiconductor elements embedded in said flexible foil, said flexible foil supporting the semiconductor elements without any rigid support being provided; and
   at least one connection line arranged substantially on said flexible foil and used for electrically connecting at least two semiconductor elements;
   wherein the semiconductor elements are at least twice as stiff as the flexible foil.

16. A microsystem comprising:
   a flexible foil;
   a plurality of semiconductor elements embedded in said flexible foil, said flexible foil supporting the semiconductor elements without any rigid support being provided; and
   at least one connection line arranged substantially on said flexible foil and used for electrically connecting at least two semiconductor elements;
   wherein at least some of the semiconductor elements consist of monocrystalline silicon.

17. A microsystem comprising:
   a flexible foil;
   a plurality of semiconductor elements embedded in said flexible foil, said flexible foil supporting the semiconductor elements without any rigid support being provided; and
   at least one connection line arranged substantially on said flexible foil and used for electrically connecting at least two semiconductor elements;
   wherein the local stiffness of active regions of the microsystem is lower than the local stiffness of neighboring regions so as to implement a local sensitiveness of the microsystem to deformations.

* * * * *